(12) United States Patent
Lee et al.

(10) Patent No.: US 7,521,297 B2
(45) Date of Patent: Apr. 21, 2009

(54) MULTICHIP PACKAGE SYSTEM

(75) Inventors: SeongMin Lee, Seoul (KR); SeungYun Ahn, Ichon-si (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 491 days.

(21) Appl. No.: 11/276,948

(22) Filed: Mar. 17, 2006

(65) Prior Publication Data

US 2007/0216007 A1    Sep. 20, 2007

(51) Int. Cl.
*H01L 21/00* (2006.01)
(52) U.S. Cl. .................. 438/127; 438/109; 257/686; 257/787
(58) Field of Classification Search .................. 438/127, 438/109; 257/686, 787
See application file for complete search history.

(56) References Cited

U.S. PATENT DOCUMENTS

| | | | |
|---|---|---|---|
| 5,557,150 A * | 9/1996 | Variot et al. .................. 257/787 |
| 6,383,846 B1 * | 5/2002 | Shen et al. .................. 438/127 |
| 6,656,773 B2 * | 12/2003 | Boyaud et al. .............. 438/127 |
| 6,746,895 B2 * | 6/2004 | Bolken et al. ............... 438/107 |
| 6,979,595 B1 | 12/2005 | James et al. |
| 6,984,894 B2 | 1/2006 | Rumsey |
| 7,179,683 B2 * | 2/2007 | Low et al. .................. 438/108 |
| 2005/0285237 A1 | 12/2005 | James |

\* cited by examiner

*Primary Examiner*—Douglas M Menz
(74) *Attorney, Agent, or Firm*—Mikio Ishimaru

(57) ABSTRACT

A multichip package system is provided forming a substrate having a plurality of molding transfer channel, connecting a first integrated circuit die on a top side of the substrate, connecting a second integrated circuit die on a bottom side of the substrate, and concurrently encapsulating the first integrated circuit die and the second integrated circuit die with a molding compound flow through the plurality of the molding transfer channels.

20 Claims, 10 Drawing Sheets

MULTICHIP PACKAGE SYSTEM

TECHNICAL FIELD

The present invention relates generally to integrated circuit packages and more particularly to multichip package.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. Integrated circuit stacking is one of the packaging trend for the reduction of package dimensions. Mixed integrated circuit technology or system in package (SIP) is another approach to reduce the space required for the integrated circuits content. But these packaging types have some problems and typically undergo multi-step process for molding the integrated circuits. Another problem is the adverse interactions, such as cross talk, between the integrated circuit in the package in various applications, such as a combination of radio frequency (RF) device and baseband.

Thus, a need still remains for the multichip package system providing low cost manufacturing as well as improved performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a multichip package system including forming a substrate having a plurality of molding transfer channel, connecting a first integrated circuit die on a top side of the substrate, connecting a second integrated circuit die on a bottom side of the substrate, and concurrently encapsulating the first integrated circuit die and the second integrated circuit die with a molding compound flow through the plurality of the molding transfer channels.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
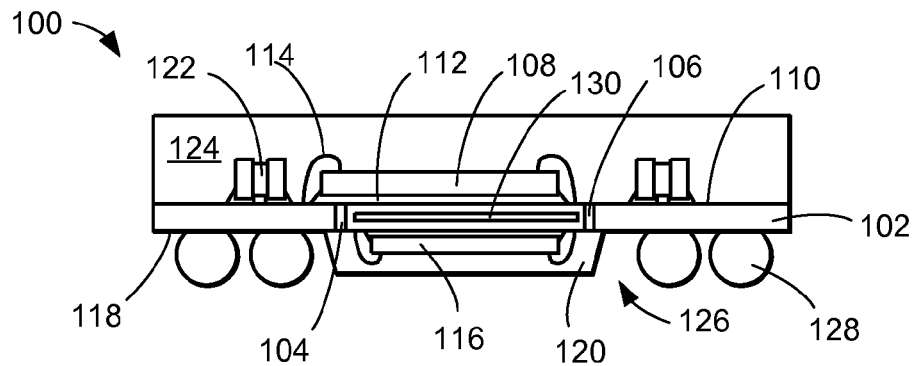
FIG. 1 is a cross-sectional view of a first multichip package system along a line 1-1' shown in FIG. 2 in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 2:
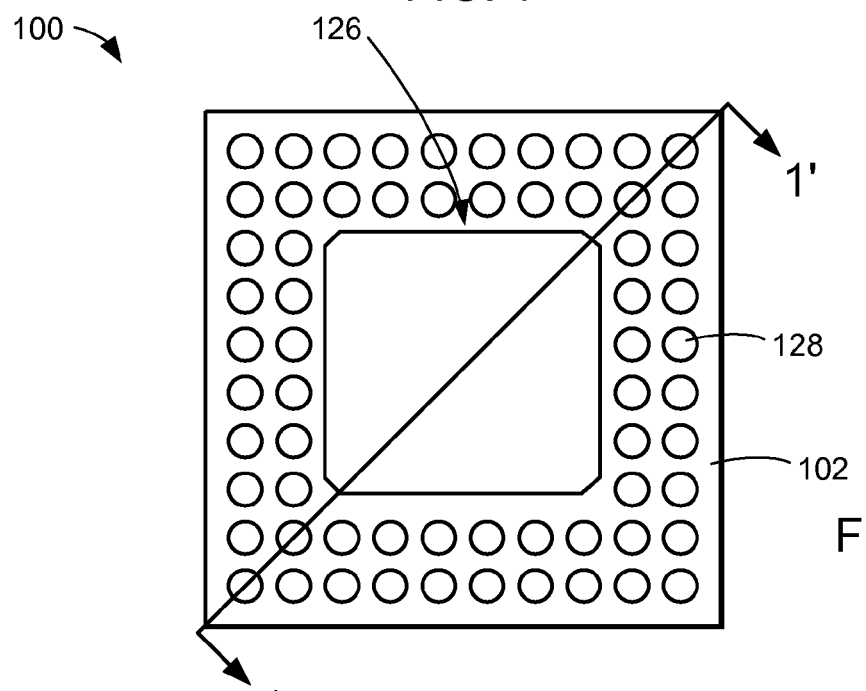
FIG. 2 is a bottom view of the first multichip package system.

Referring now to FIG. 1, therein is shown a cross-sectional view of a first multichip package system 100 along a line 1-1' shown in FIG. 2 in an embodiment of the present invention. The first multichip package system 100 includes a substrate 102 having a first molding transfer channel 104 and a second molding transfer channel 106.

A first integrated circuit die 108 is over the first molding transfer channel 104 and attaches on a top side 110 of the substrate 102 with an adhesive 112. First interconnects 114, such as bond wires, connect between the first integrated circuit die 108 and the top side 110. A second integrated circuit die 116 is between the first molding transfer channel 104 and the second molding transfer channel 106 on a bottom side 118 of the substrate 102. The adhesive 112 attaches the second integrated circuit die 116 on the bottom side 118. Second interconnects 120, such as bond wires, connect between the second integrated circuit die 116 and the bottom side 118 as well as located between the first molding transfer channel 104 and the second molding transfer channel 106. Devices 122, such as small packaged components, are on the top side 110. The substrate 102 may include a shield 130, such as a conductive material, to isolate adverse interactions, such as cross-talk, between the first integrated circuit die 108 and the second integrated circuit die 116.

A molding compound flows through the first molding transfer channel 104 and the second molding transfer channel 106 forming an encapsulation 124 to cover the first integrated circuit die 108, the first interconnects 114, the second integrated circuit die 116, the second interconnects 120, and the devices 122. The first molding transfer channel 104 and the second molding transfer channel 106 allows the encapsulation 124 formed in a single process. The encapsulation 124 forms a center gate mold 126 on the bottom side 118 minimally extending beyond the first molding transfer channel 104 and the second molding transfer channel 106 providing space for external interconnects 128, such as solder balls, for connections to the next system level (not shown), such as a printed circuit board.

Referring now to FIG. 2, therein is shown a bottom view of the first multichip package system 100. The bottom view depicts the center gate mold 126 at a central region of the substrate 102. The geometric shape, such as a square, of the center gate mold 126 is similar to the shape of the substrate 102. The external interconnects 128 are on the substrate 102. The location of the center gate mold 126 forms a symmetric number of rows of the external interconnects 128 on each side of the center gate mold 126.

For illustrative purpose, the center gate mold 126 is shown as a substantially same geometric shape as the substrate 102, although it is understood that the geometric shape of the center gate mold 126 may be different than that of the substrate 102. Also for illustrative purpose, the number of the external interconnects 128 or the rows of the external interconnects 128 are shown equal in number extending from each side of the center gate mold 126, although it is understood that the external interconnects 128 may not in a symmetrical configuration in relation to the center gate mold 126.

Figure 3:
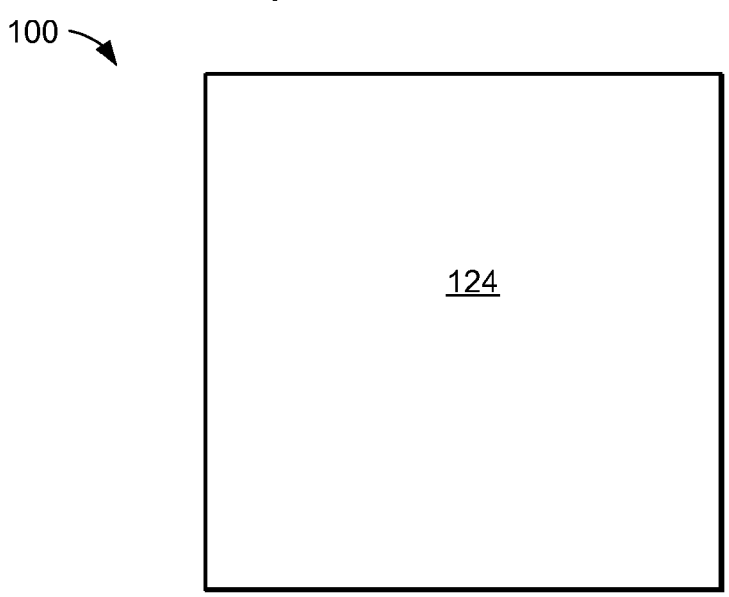
FIG. 3 is a top view of a first multichip package system.

Referring now to FIG. 3, therein is shown a top view of the first multichip package system 100. The encapsulation 124 is shown to cover the top side 110 of FIG. 1.

Figure 4:
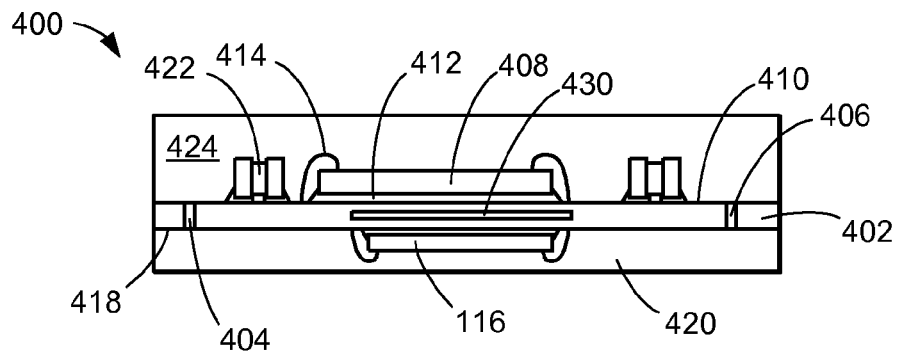
FIG. 4 is a cross-sectional view of a second multichip package system along a line 4-4' shown in FIG. 5 in yet another alternative embodiment of the present invention.
Figure 5:
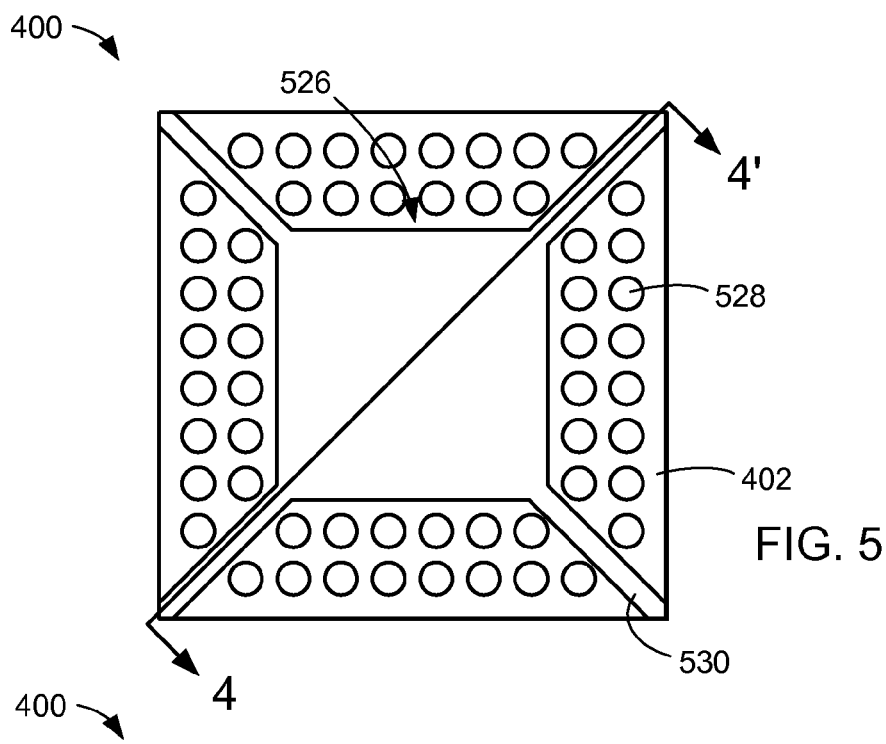
FIG. 5 is a bottom view of the second multichip package system.

Referring now to FIG. 4, therein is shown a cross-sectional view of a second multichip package system 400 along a line 4-4' shown in FIG. 5 in yet another alternative embodiment of the present invention. The second multichip package system 400 includes a substrate 402 having a first molding transfer channel 404 and a second molding transfer channel 406. The first molding transfer channel 404 and the second molding transfer channel 406 are optional.

A first integrated circuit die 408 is between the first molding transfer channel 404 and the second molding transfer channel 406 on a top side 410 of the substrate 402. An adhesive 412 attaches the first integrated circuit die 408 on the top side 410. First interconnects 414, such as bond wires, connect between the first integrated circuit die 408 and the top side 410 as well as located between the first molding transfer channel 404 and the second molding transfer channel 406. A second integrated circuit die 416 is between the first molding transfer channel 404 and the second molding transfer channel 406 on a bottom side 418 of the substrate 402. The adhesive 412 attaches the second integrated circuit die 416 on the bottom side 418. Second interconnects 420, such as bond wires, connect between the second integrated circuit die 416 and the bottom side 418 as well as located between the first molding transfer channel 404 and the second molding transfer channel 406. Devices 422, such as small packaged components, are on the top side 410 also between the first molding transfer channel 404 and the second molding transfer channel 406. The substrate 402 may include a shield 430, such as a conductive material, to isolate adverse interactions, such as cross-talk, between the first integrated circuit die 408 and the second integrated circuit die 416.

A molding compound flows through the first molding transfer channel 404 and the second molding transfer channel 406 forming an encapsulation 424 to cover the first integrated circuit die 408, the first interconnects 414, the second integrated circuit die 416, the second interconnects 420, and the devices 422. The first molding transfer channel 404 and the second molding transfer channel 406 allows the encapsulation 424 formed in a single process. The cross-sectional view shows the encapsulation 424 extending beyond the first molding transfer channel 404 and the second molding transfer channel 406 on both the top side 410 and the bottom side 418.

Referring now to FIG. 5, therein is shown a bottom view of the second multichip package system 400. The bottom view depicts a center gate mold 526 at a central region of the substrate 402 with bottom runners 530 extending from the corners of the center gate mold 526 to the corresponding corners of the substrate 402. The bottom runners 530 provide channels for the molding compound flow. The geometric shape, such as a square, of the center gate mold 526 is similar to the shape of the substrate 402. External interconnects 528 are on the substrate 402. The location of the center gate mold 526 forms a symmetric number of rows of the external interconnects 528 on each side of the center gate mold 526.

For illustrative purpose, the center gate mold 526 is shown as a substantially same geometric shape as the substrate 402, although it is understood that the geometric shape of the center gate mold 526 may be different than that of the substrate 402. Also for illustrative purpose, the number of the external interconnects 528 or the rows of the external interconnects 528 are shown equal in number extending from each side of the center gate mold 526, although it is understood that the external interconnects 528 may not in a symmetrical configuration in relation to the center gate mold 526. Further for illustrative purpose, the bottom runners 530 are shown extending from the corners of the center gate mold 526, although it is understood that the bottom runners 530 may extend other than the corners of the center gate mold 526.

Figure 6:
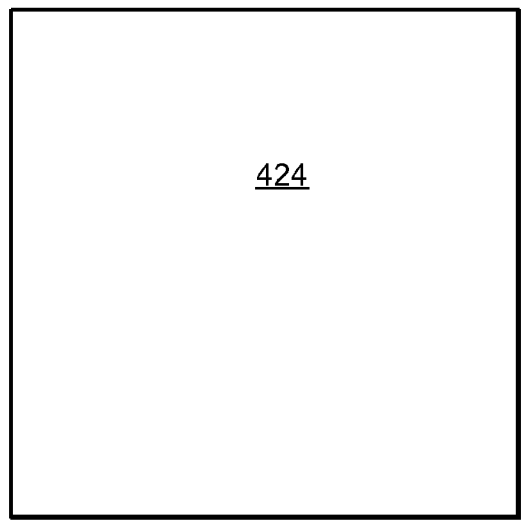
FIG. 6 is a top view of the second multichip package system.

Referring now to FIG. 6, therein is shown a top view of the second multichip package system 400. The encapsulation 424 is shown to cover the top side 410 of FIG. 4.

Figure 7:
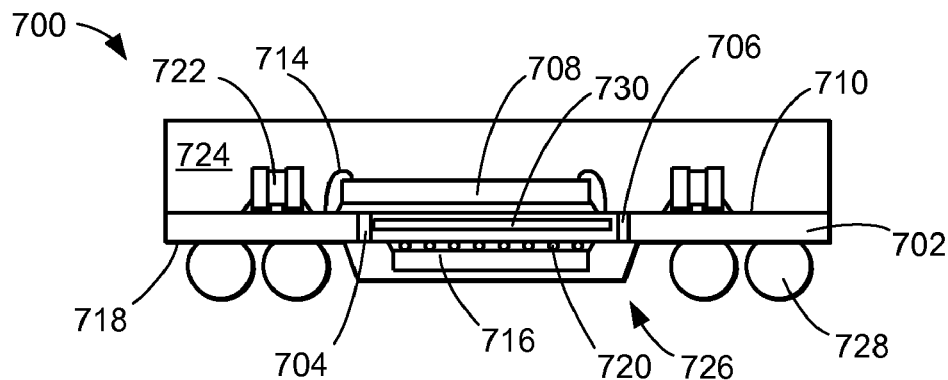
FIG. 7 is a cross-sectional view of a third multichip package system along a line 1-1' shown in FIG. 2 in an alternative embodiment of the present invention.

Referring now to FIG. 7, therein is shown a cross-sectional view of a third multichip package system 700 along the line 1-1' shown in FIG. 2 in an alternative embodiment of the present invention. The bottom view of FIG. 2 may also represent a bottom view for the third multichip package system 700.

Similarly, the third multichip package system 700 includes a substrate 702 having a first molding transfer channel 704, a second molding transfer channel 706, and a shield 730, such as a conductive material. A first integrated circuit die 708 is over the first molding transfer channel 704 and attaches on a top side 710 of the substrate 702. First interconnects 714, such as bond wires, connect between the first integrated circuit die 708 and the top side 710. Devices 722, such as small packaged components, are on the top side 710.

A second integrated circuit die 716 is between the first molding transfer channel 704 and the second molding transfer channel 706 on a bottom side 718 of the substrate 702. Second interconnects 720, such as solder bumps or solder balls, connect between the second integrated circuit die 716 and the bottom side 718.

Similarly, a molding compound flows through the first molding transfer channel 704 and the second molding transfer channel 706 forming an encapsulation 724 to cover the first integrated circuit die 708, the first interconnects 714, the second integrated circuit die 716, the second interconnects 720, and the devices 722 in a single process. The encapsulation 724 forms a center gate mold 726 on the bottom side 718 minimally extending beyond the first molding transfer channel 704 and the second molding transfer channel 706 providing space for external interconnects 728, such as solder balls, for connections to the next system level (not shown), such as a printed circuit board.

Figure 8:
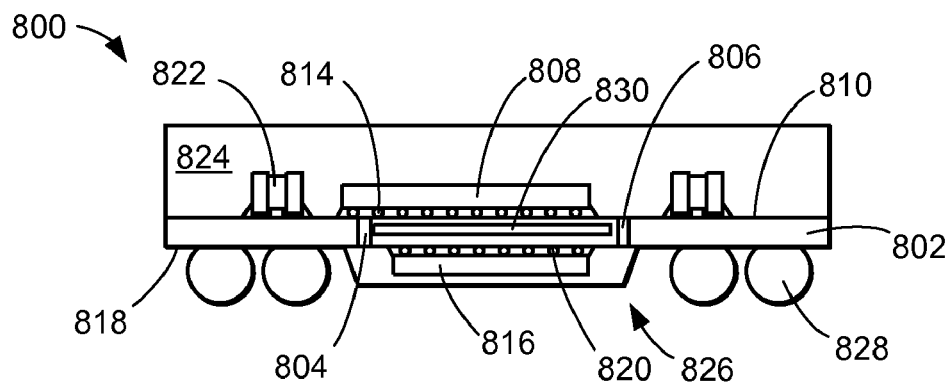
FIG. 8 is a cross-sectional view of a fourth multichip package system along a line 1-1' shown in FIG. 2 in another alternative embodiment of the present invention.

Referring now to FIG. 8, therein is shown a cross-sectional view of a fourth multichip package system 800 along the line 1-1' shown in FIG. 2 in another alternative embodiment of the present invention. The bottom view of FIG. 2 may also represent a bottom view for the fourth multichip package system 800. Similarly, the fourth multichip package system 800 includes a substrate 802 having a first molding transfer channel 80, a second molding transfer channel 806, and a shield 830, such as a conductive material. Devices 822, such as small packaged components, are on a top side 810 of the substrate 802.

A first integrated circuit die 808 is over the first molding transfer channel 804 and attaches on the top side 810 of the substrate 802. First interconnects 814, such as solder bumps or solder balls, connect between the first integrated circuit die 808 and the top side 810. A second integrated circuit die 816 is between the first molding transfer channel 804 and the second molding transfer channel 806 on a bottom side 818 of the substrate 802. Second interconnects 820, such as solder bumps or solder balls, connect between the second integrated circuit die 816 and the bottom side 818.

Similarly, a molding compound flows through the first molding transfer channel 804 and the second molding transfer channel 806 forming an encapsulation 824 to cover the first integrated circuit die 808, the first interconnects 814, the second integrated circuit die 816, the second interconnects 820, and the devices 822 in a single process. The encapsulation 824 forms a center gate mold 826 on the bottom side 818 minimally extending beyond the first molding transfer channel 804 and the second molding transfer channel 806 providing space for external interconnects 828, such as solder balls, for connections to the next system level (not shown), such as a printed circuit board.

Figure 9:
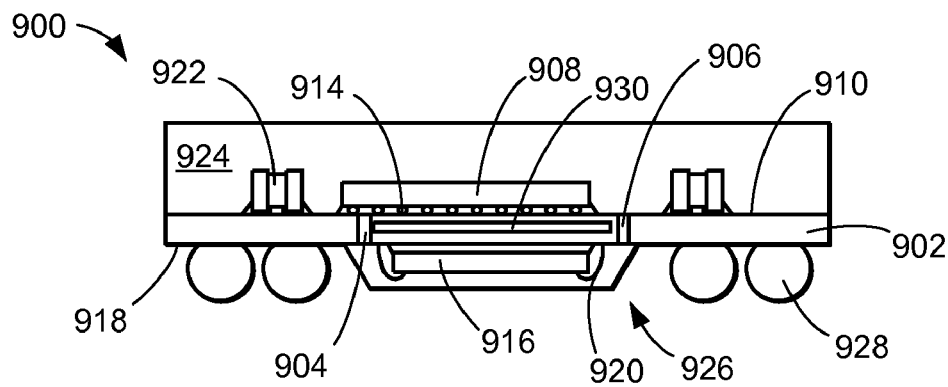
FIG. 9 is a cross-sectional view of a fifth multichip package system along a line 1-1' shown in FIG. 2 in yet another alternative embodiment of the present invention.

Referring now to FIG. 9, therein is shown a cross-sectional view of a fifth multichip package system 900 along the line 1-1' shown in FIG. 2 in yet another alternative embodiment of the present invention. The bottom view of FIG. 2 may also represent a bottom view for the fifth multichip package system 900. Similarly, the fifth multichip package system 900 includes a substrate 902 having a first molding transfer channel 904, a second molding transfer channel 906, and a shield 930, such as a conductive material. Devices 922, such as small packaged components, are on a top side 910 of the substrate 902.

A first integrated circuit die 908 is over the first molding transfer channel 904 and attaches on the top side 910 of the substrate 902. First interconnects 914, such as solder balls or solder bumps, connect between the first integrated circuit die 908 and the top side 910.

Similarly, a second integrated circuit die 916 is between the first molding transfer channel 904 and the second molding transfer channel 906 on a bottom side 918 of the substrate 902. Second interconnects 920, such as solder bumps or solder balls, connect between the second integrated circuit die 916 and the bottom side 918 as well as located between the first molding transfer channel 904 and the second molding transfer channel 906.

Similarly, a molding compound flows through the first molding transfer channel 904 and the second molding transfer channel 906 forming an encapsulation 924 to cover the first integrated circuit die 908, the first interconnects 914, the second integrated circuit die 916, the second interconnects 920, and the devices 922 in a single process. The encapsulation 924 forms a center gate mold 926 on the bottom side 918 minimally extending beyond the first molding transfer channel 904 and the second molding transfer channel 906 providing space for external interconnects 928, such as solder balls, for connections to the next system level (not shown), such as a printed circuit board.

Figure 10:
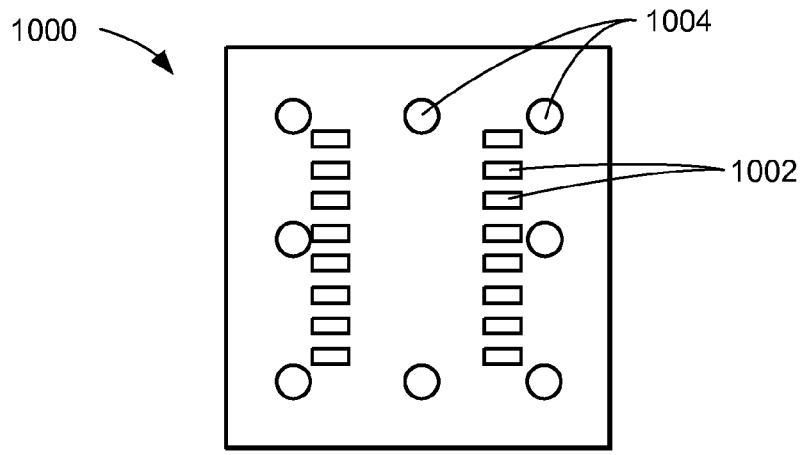
FIG. 10 is a top view of a first substrate in an embodiment of the present invention.

Referring now to FIG. 10, therein is shown a top view of a first substrate 1000 in an embodiment of the present invention. The first substrate 1000 includes bond pads 1002 for electrical connections and molding transfer channels 1004. A molding compound flows through the molding transfer channels 1004 providing a single step molding process. The molding transfer channels 1004 may be a number of different geometric shapes, such as a circle. The molding transfer channels 1004 are between the edge of the first substrate 1000 and the bond pads 1002. The geometric shape and the number of the molding transfer channels 1004 may differ than depicted in the top view.

Figure 11:
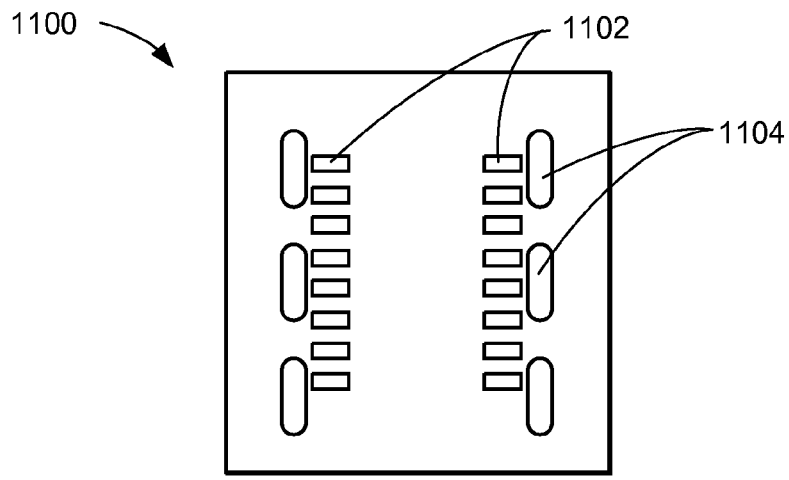
FIG. 11 is a top view of a second substrate in an alternative embodiment of the present invention.

Referring now to FIG. 11, therein is shown a top view of a second substrate 1100 in an alternative embodiment of the present invention. The second substrate 1100 includes bond pads 1102 for electrical connections and slots 1104. A molding compound flows through the slots 1104 providing a single step molding process. The slots 1104 are between the edge of the second substrate 1100 and the bond pads 1102. The slots 1104 substantially parallel the vertical edges of the second substrate 1100. The geometric shape and the number of the slots 1104 may differ than depicted in the top view.

Figure 12:
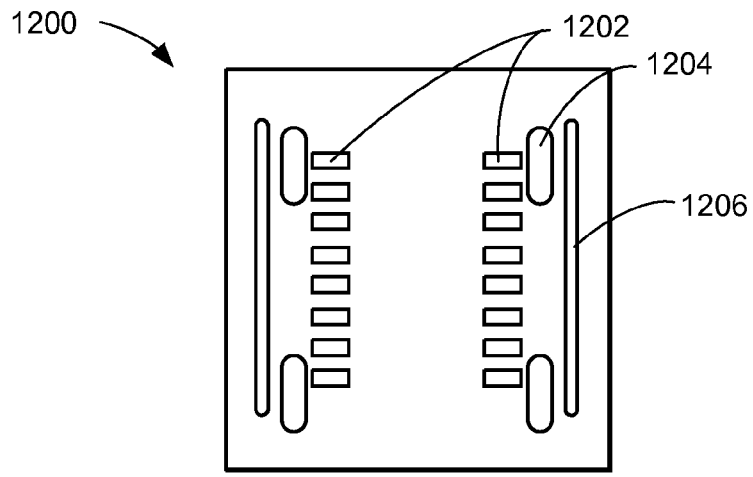
FIG. 12 is a top view of a third substrate in another alternative embodiment of the present invention.

Referring now to FIG. 12, therein is shown a top view of a third substrate 1200 in another alternative embodiment of the present invention. The third substrate 1200 includes bond pads 1202 for electrical connections and slots 1204 between the edge of the third substrate 1200 and the bond pads 1202. Slits 1206 are each located between the edge of the third substrate 1200 and the slots 1204. A molding compound flows through the slots 1204 and the slits 1206 providing a single step molding process. The slits 1206 are thinner and longer than the slots 1204. The slots 1204 and the slits 1206 substantially parallel the vertical edges of the third substrate 1200. The geometric shape and the number of the slots 1204 and the slits 1206 may differ than depicted in the top view.

Figure 13:
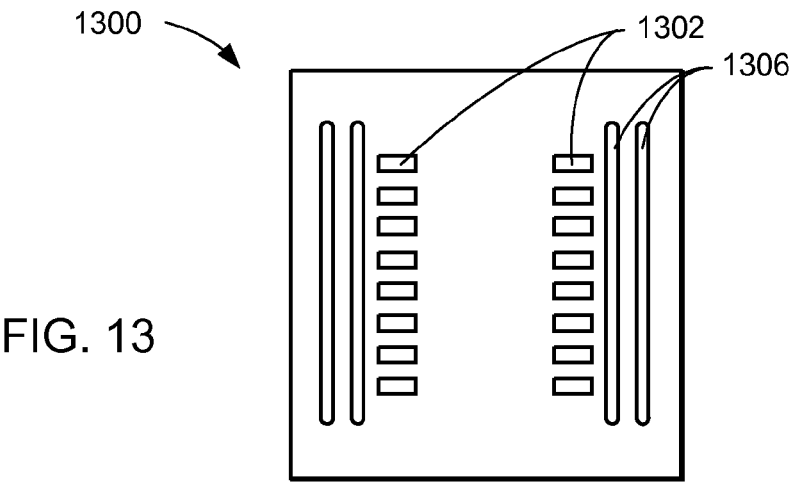
FIG. 13 is a top view of a fourth substrate in yet another alternative embodiment of the present invention.

Referring now to FIG. 13, therein is shown a top view of a fourth substrate 1300 in yet another alternative embodiment of the present invention. The fourth substrate 1300 includes bond pads 1302 for electrical connections and vertical slits 1306. The vertical slits 1306 are between the bond pads 1302 and the vertical edges of the fourth substrate 1300. A molding compound flows through the vertical slits 1306 providing a single step molding process. The vertical slits 1306 substantially parallel the vertical edges of the fourth substrate 1300.

Figure 14:
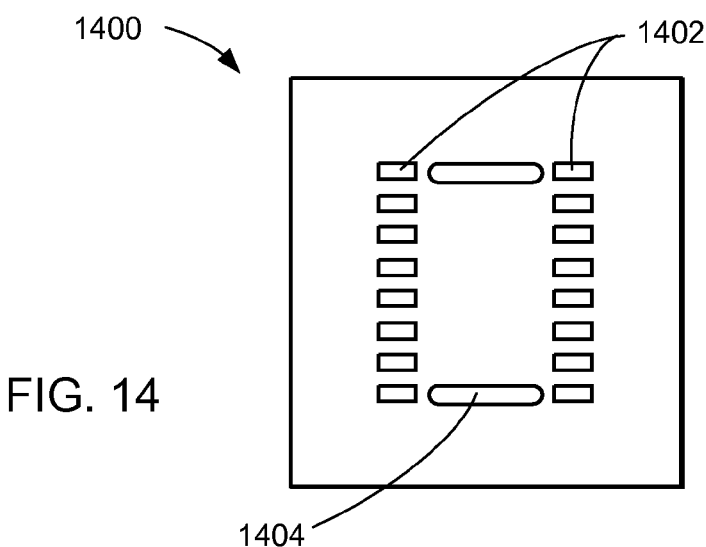
FIG. 14 is a top view of a fifth substrate in yet another alternative embodiment of the present invention.

Referring now to FIG. 14, therein is shown a top view of a fifth substrate 1400 in yet another alternative embodiment of the present invention. The fifth substrate 1400 includes bond pads 1402 for electrical connections and horizontal slots 1404. The horizontal slots 1404 are between the bond pads 1402 and parallel the horizontal edges of the fifth substrate 1400. A molding compound flows through the horizontal slots 1404 providing a single step molding process.

Figure 15:
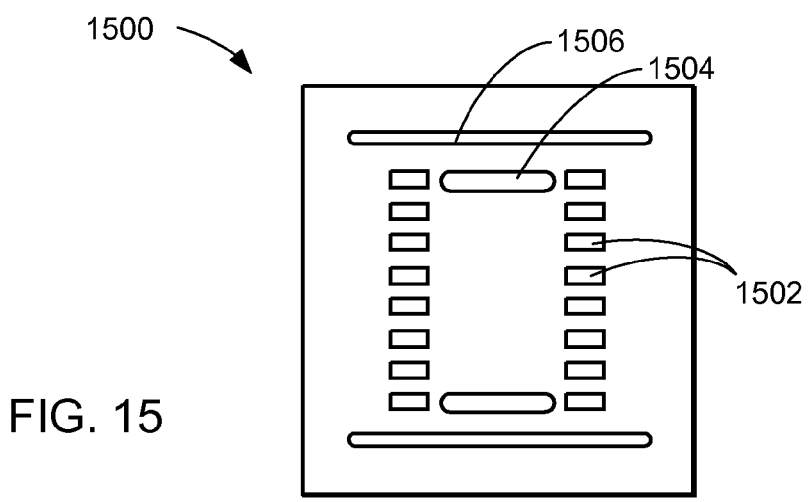
FIG. 15 is a top view of a sixth substrate in yet another alternative embodiment of the present invention.

Referring now to FIG. 15, therein is shown a top view of a sixth substrate 1500 in yet another alternative embodiment of the present invention. The sixth substrate 1500 includes bond pads 1502 for electrical connections, horizontal slots 1504, and horizontal slits 1506. The horizontal slots 1504 are between the bond pads 1502 and parallel the horizontal edges of the sixth substrate 1500. The horizontal slits 1506 also parallel the horizontal edges of the sixth substrate 1500 and are also above as well as below the bond pads 1502. A molding compound flows through the horizontal slots 1504 and the horizontal slits 1506 providing a single step molding process.

Figure 16:
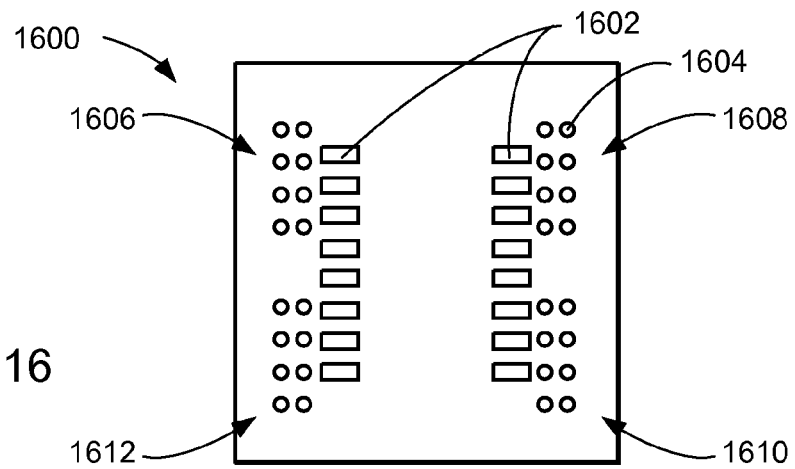
FIG. 16 is a top view of a seventh substrate in yet another alternative embodiment of the present invention.

Referring now to FIG. 16, therein is shown a top view of a seventh substrate 1600 in yet another alternative embodiment of the present invention. The seventh substrate 1600 includes bond pads 1602 for electrical connections and molding transfer channels 1604 in groups, a first group 1606, a second group 1608, a third group 1610, and a fourth group 1612. The first group 1606 is at the left upper corner of the seventh substrate 1600 between the bond pads 1602 and the vertical edges of the seventh substrate 1600. The second group 1608 is at the right upper corner of the seventh substrate 1600 between the bond pads 1602 and the vertical edges of the seventh substrate 1600. The third group 1610 is at the right lower corner of the seventh substrate 1600 between the bond pads 1602 and the vertical edges of the seventh substrate 1600. The fourth group 1612 is at the left lower corner of the seventh substrate 1600 between the bond pads 1602 and the vertical edges of the seventh substrate 1600. A molding compound flows through the molding transfer channels 1604 providing a single step molding process.

Figure 17:
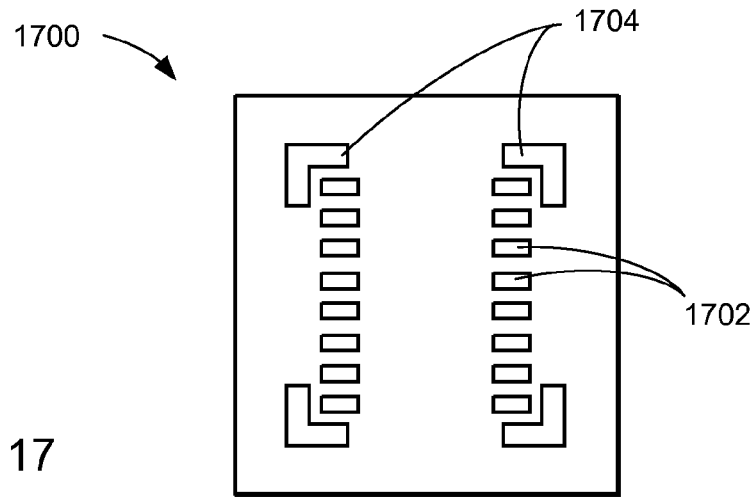
FIG. 17 is a top view of an eighth substrate in yet another alternative embodiment of the present invention.

Referring now to FIG. 17, therein is shown a top view of an eighth substrate 1700 in yet another alternative embodiment of the present invention. The eighth substrate 1700 includes bond pads 1702 and molding transfer channels 1704 in a geometric shape of orthogonal segments. The molding transfer channels 1704 are at the corners of the eighth substrate 1700 between the edges of the eighth substrate 1700 and the bond pads 1702. A molding compound flows through the molding transfer channels 1704 providing a single step molding process.

Figure 18:
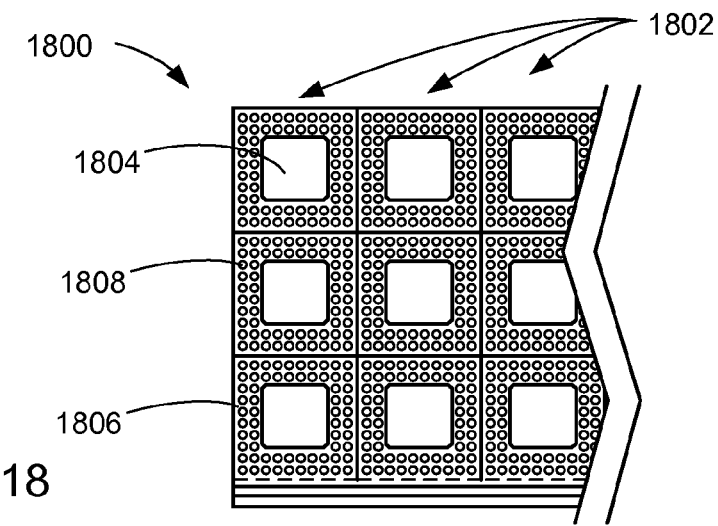
FIG. 18 is a bottom view of a first array of a multichip package system in an embodiment of the present invention.

Referring now to FIG. 18, therein is shown a bottom view of a first array 1800 of a multichip package system 1802 in an embodiment of the present invention. The multichip package system 1802 may represent the first multichip package system 100 of FIG. 1, the third multichip package system 700 of FIG. 7, the fourth multichip package system 800 of FIG. 8, and the fifth multichip package system 900 of FIG. 9. The first array 1800 includes rows of the multichip package system 1802.

Each of the multichip package system 1802 includes a center gate mold 1804 at a central region of a substrate 1806. The geometric shape, such as a square, of the center gate mold 1804 is similar to the shape of the substrate 1806. External interconnects 1808 are on the substrate 1806. The location of the center gate mold 1804 forms a symmetric number of rows of the external interconnects 1808 on each side of the center gate mold 1804.

Figure 19:
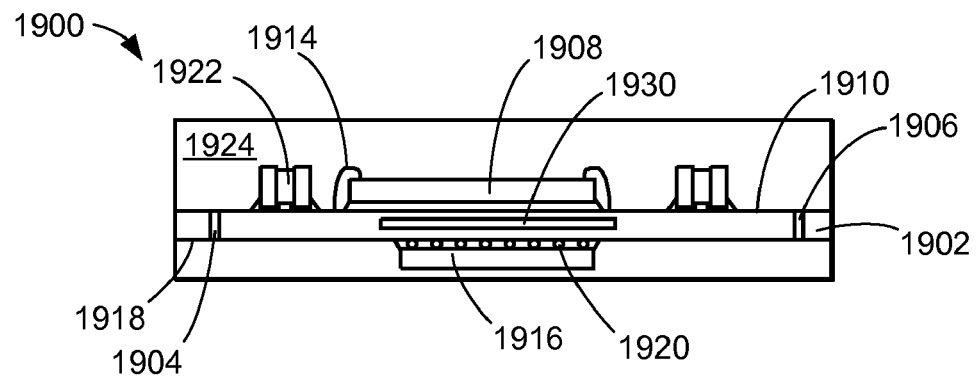
FIG. 19 is a cross-sectional view of a sixth multichip package system along a line 4-4' shown in FIG. 5 in yet another alternative embodiment of the present invention.

Referring now to FIG. 19, therein is shown a cross-sectional view of a sixth multichip package system 1900 along the line 4-4' shown in FIG. 5 in yet another alternative embodiment of the present invention. The bottom view of FIG. 5 may also represent a bottom view for the sixth multichip package system 1900.

Similarly, the sixth multichip package system 1900 includes a substrate 1902 having a first molding transfer channel 1904, a second molding transfer channel 1906, and a shield 1930, such as a conductive material. The first molding transfer channel 1904 and the second molding transfer channel 1906 are optional. A first integrated circuit die 1908 is between the first molding transfer channel 1904 and the second molding transfer channel 1906 on a top side 1910 of the substrate 1902. First interconnects 1914, such as bond wires, connect between the first integrated circuit die 1908 and the top side 1910. Devices 1922, such as small packaged components, are on the top side 1910.

A second integrated circuit die 1916 is between the first molding transfer channel 1904 and the second molding transfer channel 1906 on a bottom side 1918 of the substrate 1902.

Second interconnects 1920, such as solder bumps or solder balls, connect between the second integrated circuit die 1916 and the bottom side 1918.

Similarly, a molding compound flows through the first molding transfer channel 1904 and the second molding transfer channel 1906 forming an encapsulation 1924 to cover the first integrated circuit die 1908, the first interconnects 1914, the second integrated circuit die 1916, the second interconnects 1920, and the devices 1922 in a single process.

Figure 20:
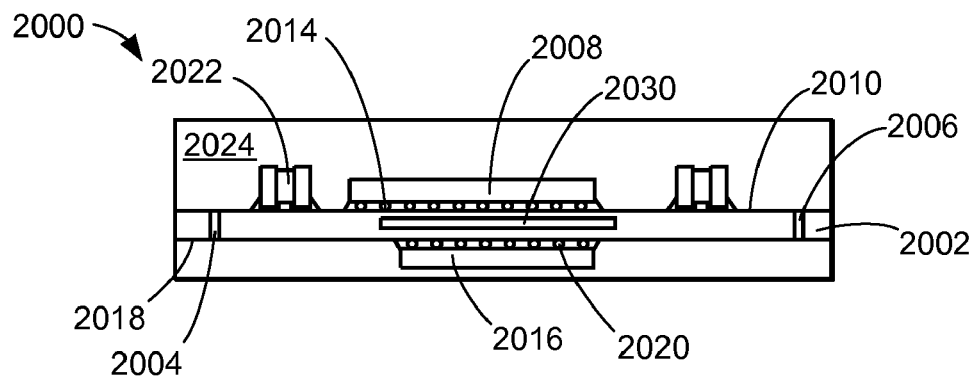
FIG. 20 is a cross-sectional view of a seventh multichip package system along a line 4-4' shown in FIG. 5 in yet another alternative embodiment of the present invention.

Referring now to FIG. 20, therein is shown a cross-sectional view of a seventh multichip package system 2000 along the line 4-4' shown in FIG. 5 in yet another alternative embodiment of the present invention. The bottom view of FIG. 5 may also represent a bottom view for the seventh multichip package system 2000. Similarly, the seventh multichip package system 2000 includes a substrate 2002 having a first molding transfer channel 2004, a second molding transfer channel 2006, and a shield 2030, such as a conductive material. The first molding transfer channel 2004 and the second molding transfer channel 2006 are optional. Devices 2022, such as small packaged components, are on a top side 2010 of the substrate 2002.

A first integrated circuit die 2008 is between the first molding transfer channel 2004 and the second molding transfer channel 2006 on the top side 2010 of the substrate 2002. First interconnects 2014, such as solder bumps or solder balls, connect between the first integrated circuit die 2008 and the top side 2010. A second integrated circuit die 2016 is between the first molding transfer channel 2004 and the second molding transfer channel 2006 on a bottom side 2018 of the substrate 2002. Second interconnects 2020, such as solder bumps or solder balls, connect between the second integrated circuit die 2016 and the bottom side 2018.

Similarly, a molding compound flows through the first molding transfer channel 2004 and the second molding transfer channel 2006 forming an encapsulation 2024 to cover the first integrated circuit die 2008, the first interconnects 2014, the second integrated circuit die 2016, the second interconnects 2020, and the devices 2022 in a single process.

Figure 21:
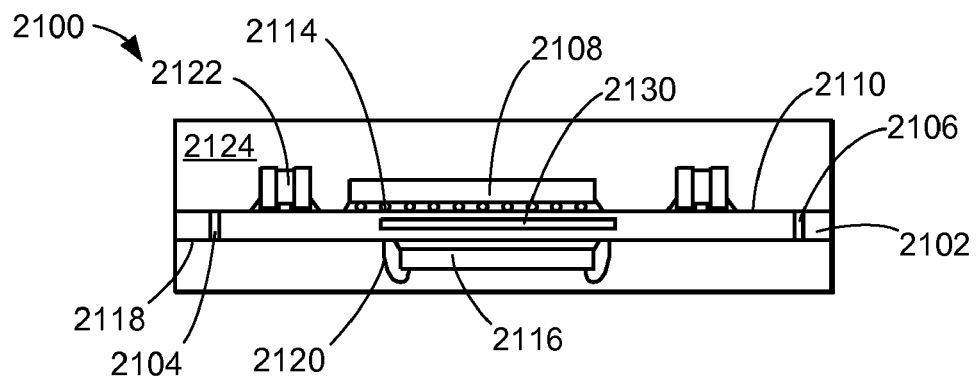
FIG. 21 is a cross-sectional view of an eighth multichip package system along a line 4-4' shown in FIG. 5 in yet another alternative embodiment of the present invention.

Referring now to FIG. 21, therein is shown a cross-sectional view of an eighth multichip package system 2100 along the line 4-4' shown in FIG. 5 in yet another alternative embodiment of the present invention. The bottom view of FIG. 5 may also represent a bottom view for the eighth multichip package system 2100. Similarly, the eighth multichip package system 2100 includes a substrate 2102 having a first molding transfer channel 2104, a second molding transfer channel 2106, and a shield 2130, such as a conductive material. The first molding transfer channel 2104 and the second molding transfer channel 2106 are optional. Devices 2122, such as small packaged components, are on a top side 2110 of the substrate 2102.

A first integrated circuit die 2108 is between the first molding transfer channel 2104 and the second molding transfer channel 2106 on the top side 2110 of the substrate 2102. First interconnects 2114, such as solder balls or solder bumps, connect between the first integrated circuit die 2108 and the top side 2110.

Similarly, a second integrated circuit die 2116 is between the first molding transfer channel 2104 and the second molding transfer channel 2106 on a bottom side 2118 of the substrate 2102. Second interconnects 2120, such as solder bumps or solder balls, connect between the second integrated circuit die 2116 and the bottom side 2118 as well as located between the first molding transfer channel 2104 and the second molding transfer channel 2106.

Similarly, a molding compound flows through the first molding transfer channel 2104 and the second molding transfer channel 2106 forming an encapsulation 2124 to cover the first integrated circuit die 2108, the first interconnects 2114, the second integrated circuit die 2116, the second interconnects 2120, and the devices 2122 in a single process.

Figure 22:
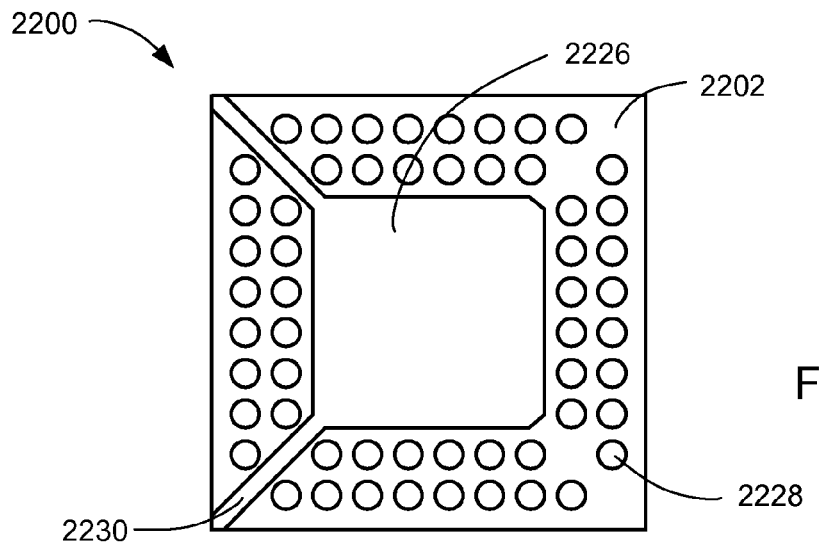
FIG. 22 is a bottom view of a multichip package system in an embodiment of the present invention.

Referring now to FIG. 22, therein is shown a bottom view of a multichip package system 2200 in an embodiment of the present invention. The bottom view may represent a bottom view for the second multichip package system 400 of FIG. 4, the sixth multichip package system 1900 of FIG. 19, the seventh multichip package system 2000 of FIG. 20, and the eighth multichip package system 2100 of FIG. 21. The bottom view depicts a center gate mold 2226 at a central region of a substrate 2202 with bottom runners 2230 extending from the left upper and lower corners of the center gate mold 2226 to the corresponding corners of the substrate 2202. The bottom runners 2230 provide channels for the molding compound flow. The geometric shape, such as a square, of the center gate mold 2226 is similar to the shape of the substrate 2202. External interconnects 2228 are on the substrate 2202. The location of the center gate mold 2226 forms a symmetric number of rows of the external interconnects 2228 on each side of the center gate mold 2226.

For illustrative purpose, the center gate mold 2226 is shown as a substantially same geometric shape as the substrate 2202, although it is understood that the geometric shape of the center gate mold 2226 may be different than that of the substrate 2202. Also for illustrative purpose, the number of the external interconnects 2228 or the rows of the external interconnects 2228 are shown equal in number extending from each side of the center gate mold 2226, although it is understood that the external interconnects 2228 may not in a symmetrical configuration in relation to the center gate mold 2226. Further for illustrative purpose, the bottom runners 2230 are shown extending from the left upper and lower corners of the center gate mold 2226, although it is understood that the bottom runners 2230 may extend other than the left upper and lower corners of the center gate mold 2226.

Figure 23:
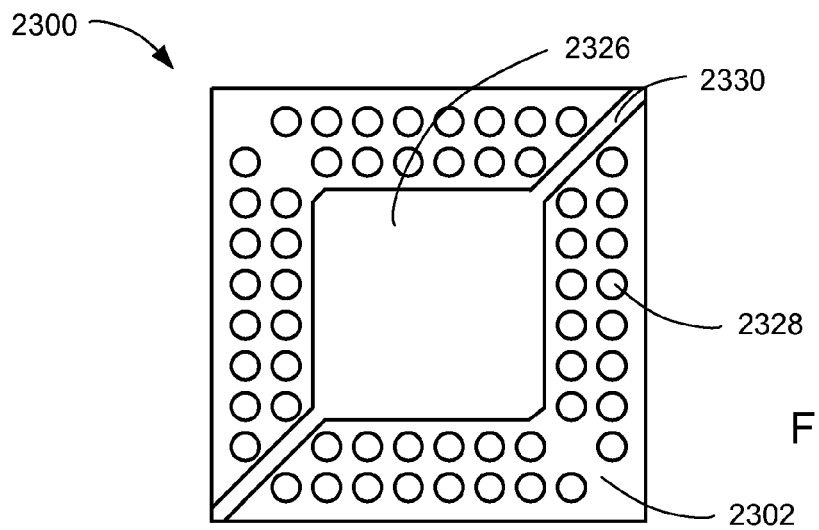
FIG. 23 is a bottom view of a multichip package system in an alternative embodiment of the present invention.

Referring now to FIG. 23, therein is shown a bottom view of a multichip package system 2300 in an alternative embodiment of the present invention. The bottom view may represent a bottom view for the second multichip package system 400 of FIG. 4, the sixth multichip package system 1900 of FIG. 19, the seventh multichip package system 2000 of FIG. 20, and the eighth multichip package system 2100 of FIG. 21. The bottom view depicts a center gate mold 2326 at a central region of a substrate 2302 with bottom runners 2330 extending from the left lower and right upper corners of the center gate mold 2326 to the corresponding corners of the substrate 2302. The bottom runners 2330 provide channels for the molding compound flow. The geometric shape, such as a square, of the center gate mold 2326 is similar to the shape of the substrate 2302. External interconnects 2328 are on the substrate 2302. The location of the center gate mold 2326 forms a symmetric number of rows of the external interconnects 2328 on each side of the center gate mold 2326.

For illustrative purpose, the center gate mold 2326 is shown as a substantially same geometric shape as the substrate 2302, although it is understood that the geometric shape of the center gate mold 2326 may be different than that of the substrate 2302. Also for illustrative purpose, the number of the external interconnects 2328 or the rows of the external interconnects 2328 are shown equal in number extending from each side of the center gate mold 2326, although it is understood that the external interconnects 2328 may not in a symmetrical configuration in relation to the center gate mold 2326. Further for illustrative purpose, the bottom runners 2330 are shown extending from the left upper and lower corners of the center gate mold 2326, although it is understood that the bottom runners 2330 may extend other than the left upper and lower corners of the center gate mold 2326.

Figure 24:
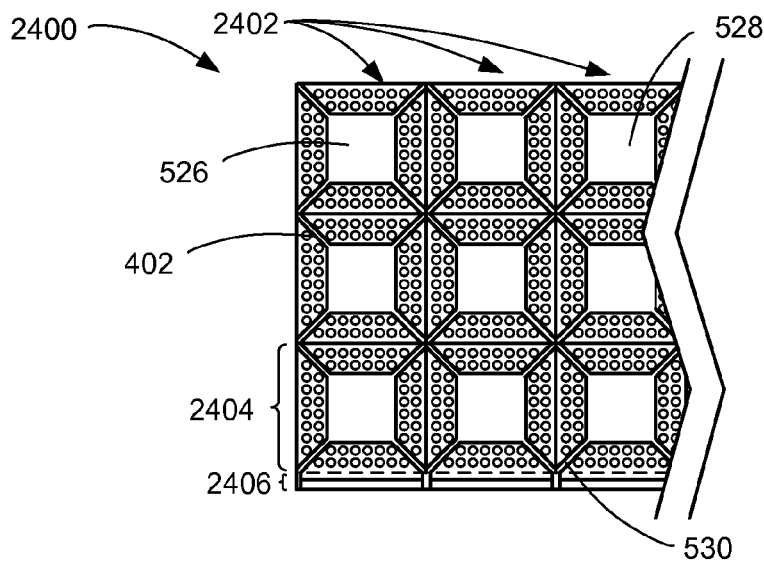
FIG. 24 is a bottom view of a second array of the second multichip package system in an embodiment of the present invention.

Referring now to FIG. 24, therein is shown a bottom view of a second array 2400 of the second multichip package system 400 in an embodiment of the present invention. The second array 2400 may also represent an array of the sixth multichip package system 1900 of FIG. 19, the seventh multichip package system 2000 of FIG. 20, and the eighth multichip package system 2100 of FIG. 21. The second array 2400 includes rows of a multichip package system 2402. Each of the second multichip package system 400 includes the center gate mold 526 at a central region of the substrate 402. The external interconnects 528 are on the substrate 402.

The bottom runners 530 of from each of the second multichip package system 400 in the second array 2400 are connected forming a molding compound flow channel spanning the second array 2400. A first row 2404 of the second array 2400 includes an extension 2406 of the substrate 402. The bottom runners 530 also extend to the edge of the extension 2406.

Figure 25:
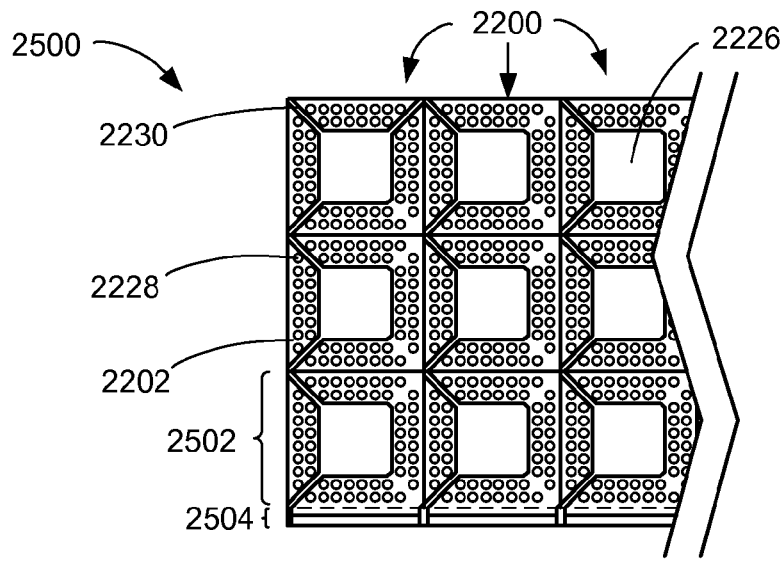
FIG. 25 is a bottom view of a third array of the multichip package system in an alternative embodiment of the present invention.

Referring now to FIG. 25, therein is shown a bottom view of a third array 2500 of the multichip package system 2200 in an alternative embodiment of the present invention. The second array 2400 may also represent an array of the second multichip package system 400 of FIG. 4, the sixth multichip package system 1900 of FIG. 19, the seventh multichip package system 2000 of FIG. 20, and the eighth multichip package system 2100 of FIG. 21. The second array 2400 includes rows of the multichip package system 2200. Each of the multichip package system 2200 includes the center gate mold 2226 at a central region of the substrate 2202. The external interconnects 2228 are on the substrate 2202.

The bottom runners 2230 of from each of the multichip package system 2200 in the third array 2500 are connected forming a molding compound flow channel spanning the third array 2500. The multichip package system 2200 at the left upper corner of the third array 2500 has an additional instance of the bottom runners 2230 extending from the center gate mold 2226 to the right upper corner and connecting to one of the bottom runners 2230 of the adjacent instance of the multichip package system 2200. A first row 2502 of the third array 2500 includes an extension 2504 of the substrate 2202. The bottom runners 2230 extend to the edge of the extension 2504.

Figure 26:
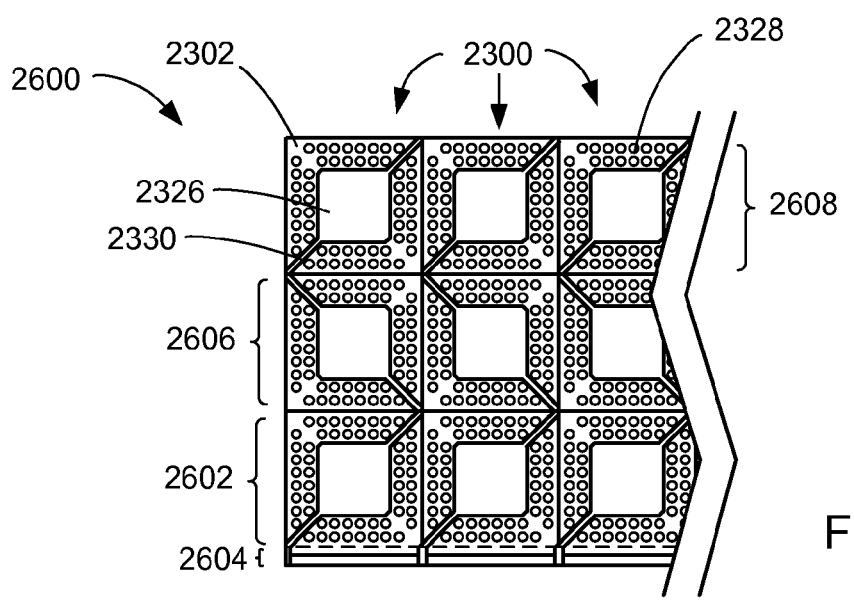
FIG. 26 is a bottom view of a fourth array of the multichip package system in another alternative embodiment of the present invention.

Referring now to FIG. 26, therein is shown a bottom view of a fourth array 2600 of the multichip package system 2300 in another alternative embodiment of the present invention. The fourth array 2600 may also represent an array of the second multichip package system 400 of FIG. 4, the sixth multichip package system 1900 of FIG. 19, the seventh multichip package system 2000 of FIG. 20, and the eighth multichip package system 2100 of FIG. 21. The second array 2400 includes rows of the multichip package system 2300. Each of the multichip package system 2300 includes the center gate mold 2326 at a central region of the substrate 2302. The external interconnects 2328 are on the substrate 2302.

The bottom runners 2330 of from each of the multichip package system 2300 in the third array 2500 are connected forming a molding compound flow channel spanning the third array 2500. A first row 2602 of the fourth array 2600 includes an extension 2604 of the substrate 2302. The bottom runners 2330 extend to the edge of the extension 2604. The first row 2602 has the bottom runners 2330 extending from the center gate mold 2326 to the left lower and right upper corners of the multichip package system 2300. A second row 2606 has the bottom runners 2330 extending from the center gate mold 2326 to the right lower and left upper corners of the multichip package system 2300 to connect to the bottom runners 2330 in the first row 2602 and a third row 2608. This pattern of the bottom runners 2330 from one row to the next row alternates in the fourth array 2600.

Figure 27:
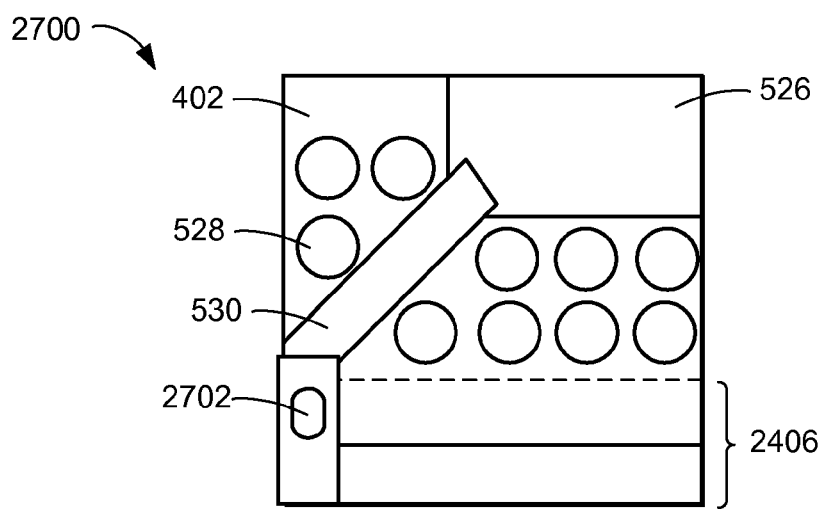
FIG. 27 is a more detailed bottom view of the extension of the first row of the second array.

Referring now to FIG. 27, therein is shown a more detailed bottom view of the extension 2406 of the first row 2404 of the second array 2400. This bottom view may also represent the bottom view of the third array 2500 of FIG. 25 or the fourth array 2600 of FIG. 26. The bottom view depicts a corner of the extension 2406 with one instance of the bottom runners 530 extending from the center gate mold 526, and the external interconnects 528 on the substrate 402. The bottom runners 530 extend into the extension 2406. A front slot 2702 for molding compound flow for the bottom runners 530 is part of the extension 2406.

Figure 28:
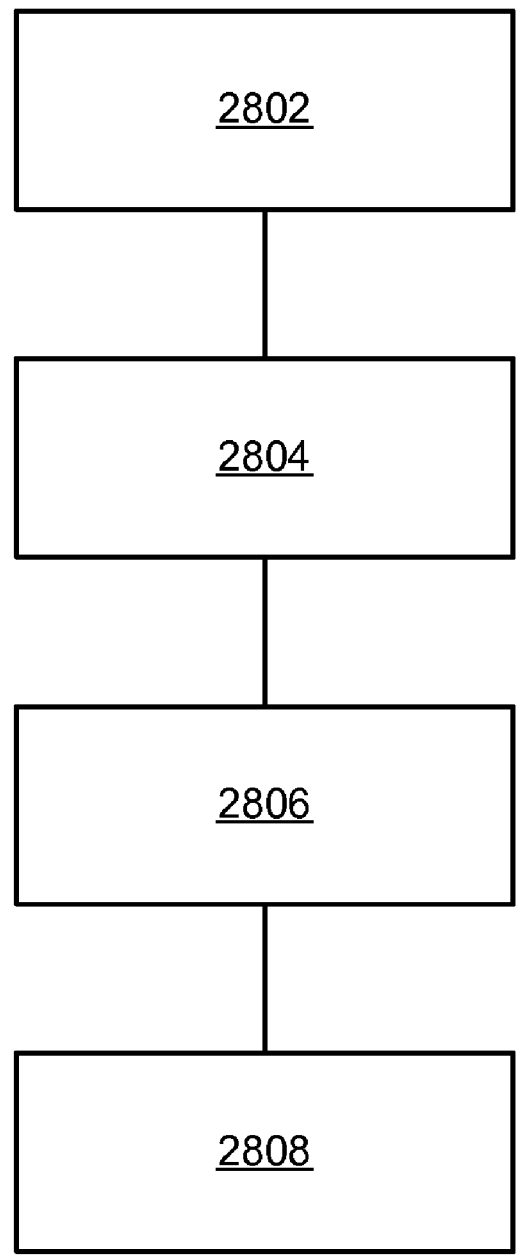
FIG. 28 is a flow chart of a multichip package system for the manufacture of the multichip package system in an embodiment of the present invention.

Referring now to FIG. 28, therein is shown a flow chart of a multichip package system 2800 for the manufacture of the multichip package system 100 in an embodiment of the present invention. The system 2800 includes forming a substrate having a plurality of molding transfer channels in a block 2802; connecting a first integrated circuit die on a top side of the substrate in a block 2804; connecting a second integrated circuit die on a bottom side of the substrate in a block 2806; and concurrently encapsulating the first integrated circuit die and the second integrated circuit die with a molding compound flow through the plurality of the molding transfer channels in a block 2808.

It has been discovered that the present invention thus has numerous aspects.

It has been discovered that in the present invention adding molding transfer channels in the substrate or the extension of the substrate allows the molding compound to encapsulate both the top side and the bottom side of the integrated circuit package in a single step.

An aspect is that the present invention provides molding transfer channels in the substrate which may be configured to provide flexibility to accommodate different integrated circuit sizes and other devices on the substrate.

Another aspect of the present invention is that the molding transfer channels in the substrate may be optional. The molding compound may encapsulate the bottom side of the integrated circuit package with one or more front slot molding transfer channels in an extension of the array of the integrated circuit package, before singulation. Bottom runners connect with the front slot in the extension and provide a channel for the molding compound to flow from each integrated circuit package in the array to another.

Thus, it has been discovered that the multichip package system method of the present invention furnishes important and heretofore unknown and unavailable solutions, capabilities, and functional aspects for increasing chip density in systems while simplifying manufacturing process. The resulting processes and configurations are straightforward, cost-effective, uncomplicated, highly versatile and effective, can be implemented by adapting known technologies, and are thus readily suited for efficiently and economically manufacturing multichip packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A multichip package system comprising:
forming a substrate having a plurality of molding transfer channels;
connecting a first integrated circuit die on a top side of the substrate;
connecting a second integrated circuit die on a bottom side of the substrate; and concurrently encapsulating the first integrated circuit die and the second integrated circuit die with a molding compound flow through the plurality of the molding transfer channels.

2. The system as claimed in claim 1 wherein forming the substrate includes forming a shield in the substrate.

3. The system as claimed in claim 1 wherein:
forming the substrate having the plurality of the molding transfer channels comprises:
   forming an extension of the substrate, the extension having a molding transfer channel; and
   concurrently encapsulating the first integrated circuit die and the second integrated circuit die with the molding compound flow through the plurality of the molding transfer channels further comprises:
      forming a center gate mold with the molding compound flow from the molding transfer channel through bottom runners at the bottom side of the substrate to cover the second integrated circuit die.

4. The system as claimed in claim 1 wherein connecting the first integrated circuit die on the top side includes attaching the first integrated circuit die over a portion of the plurality of the molding transfer channels.

5. The system as claimed in claim 1 wherein forming the substrate having the plurality of the molding transfer channels comprises:
forming the substrate having bond pads; and
forming a configuration of the plurality of the molding transfer channels comprised of the molding transfer channels between the bond pads and edges of the substrate, the molding transfer channels between the bond pads, the molding transfer channels in a vertical orientation, the molding transfer channels in a horizontal orientation, and a combination thereof.

6. A multichip package system comprising:
forming a substrate having a plurality of molding transfer channels and a bond pad;
connecting a first integrated circuit die and a device on a top side of the substrate;
connecting a second integrated circuit die on a bottom side of the substrate;
concurrently encapsulating the first integrated circuit die and the second integrated circuit die with a molding compound flow through the plurality of the molding transfer channels; and
attaching an external interconnect on the bottom side.

7. The system as claimed in claim 6 wherein connecting the first integrated circuit die includes connecting a bond wire between the first integrated circuit die and the top side.

8. The system as claimed in claim 6 wherein connecting the first integrated circuit die includes connecting a solder bump between the first integrated circuit die and the top side.

9. The system as claimed in claim 6 wherein connecting the second integrated circuit die includes connecting a bond wire between the second integrated circuit die and the bottom side.

10. The system as claimed in claim 6 wherein connecting the second integrated circuit die includes connecting a solder bump between the second integrated circuit die and the bottom side.

11. A multichip package system comprising:
a substrate having a plurality of molding transfer channels;
a first integrated circuit die on a top side of the substrate;
a second integrated circuit die on a bottom side of the substrate; and
an encapsulation to cover the first integrated circuit die and the second integrated circuit die with a molding compound flow through the plurality of the molding transfer channels.

12. The system as claimed in claim 11 wherein the substrate includes a shield in the substrate.

13. The system as claimed in claim 11 wherein:
the substrate having the plurality of the molding transfer channels comprises:
   an extension of the substrate, the extension having a molding transfer channel; and
an encapsulation to cover the first integrated circuit die and the second integrated circuit die with the molding compound flow through the plurality of the molding transfer channels further comprises:
   a center gate mold with the molding compound flow from the molding transfer channel through bottom runners at the bottom side of the substrate to cover the second integrated circuit die.

14. The system as claimed in claim 11 wherein the first integrated circuit die on the top side includes the first integrated circuit die over a portion of the plurality of the molding transfer channels.

15. The system as claimed in claim 11 wherein the substrate having the plurality of the molding transfer channels comprises:
the substrate having bond pads; and
a configuration of the plurality of the molding transfer channels comprised of the molding transfer channels between the bond pads and edges of the substrate, the molding transfer channels between the bond pads, the molding transfer channels in a vertical orientation, the molding transfer channels in a horizontal orientation, and a combination thereof.

16. The system as claimed in claim 11 wherein:
the substrate having the plurality of the molding transfer channels has a shield therein;
the first integrated circuit die on the top side of the substrate is attached with an adhesive;
the second integrated circuit die on the bottom side of the substrate is attached with the adhesive; and
the encapsulation to cover the first integrated circuit die and the second integrated circuit die with a molding compound through the molding transfer channel is a cover of the top side;
further comprising:
the substrate having a bond pad; and
an external interconnect on the bottom side.

17. The system as claimed in claim 16 wherein the first integrated circuit die on the top side includes a bond wire between the first integrated circuit die and the top side.

18. The system as claimed in claim 16 wherein the first integrated circuit die on the top side includes a solder bump between the first integrated circuit die and the top side.

19. The system as claimed in claim 16 wherein the second integrated circuit die on the bottom side includes a bond wire between the second integrated circuit die and bottom side.

20. The system as claimed in claim 16 wherein the second integrated circuit die on the bottom side includes a solder bump between the second integrated circuit die and bottom side.

* * * * *